United States Patent [19]

Haraszti

[11] 4,296,428
[45] Oct. 20, 1981

[54] MERGED FIELD EFFECT TRANSISTOR CIRCUIT AND FABRICATION PROCESS

[75] Inventor: Tegzi P. Haraszti, Garden Grove, Calif.

[73] Assignee: Rockwell International Corporation, El Segundo, Calif.

[21] Appl. No.: 52,881

[22] Filed: Jun. 28, 1979

[51] Int. Cl.$^3$ ............................................. H01L 27/02
[52] U.S. Cl. ........................................... 357/41; 357/4; 357/22; 357/23; 357/45; 357/46; 357/47; 357/55; 357/56; 148/1.5
[58] Field of Search .................. 357/22, 23, 4, 41, 45, 357/46, 49, 55, 56; 148/1.5 T

[56] References Cited

U.S. PATENT DOCUMENTS

| | | | |
|---|---|---|---|
| 4,072,974 | 2/1978 | Ipri | 357/49 |
| 4,084,108 | 4/1978 | Fujimoto | 357/41 |
| 4,107,725 | 8/1978 | Yoshida et al. | 357/41 |

Primary Examiner—Edward J. Wojciechowicz
Attorney, Agent, or Firm—H. Fredrick Hamann; Daniel R. McGlynn

[57] ABSTRACT

A three dimensional merged field effect transistor device, and circuits incorporating such devices, which are fabricated from two or more bodies of semiconductor material disposed on a carrier or substrate. The structure includes at least two bodies of semiconductor material, each body consisting of material of both a first and a second conductivity type. Each body has two spaced apart surfaces such that a portion of the first surface of the first body is disposed adjacent to a surface of the second body and separated therefrom by a dielectric layer so that the surface portion on the first body forms the gate electrode of a first field effect transistor, and the source, channel, and the drain regions of the first field effect transistor being formed by surface zones on the surface of the second body. On the second surface of the first body there are also three adjacent surface zones of alternating conductivity type which form the source, channel, and drain region of a second field effect transistor. In the first body one of the surface regions forming the source of the second field effect transistor is electrically connected with the surface portion on the second surface forming the gate of the first field effect transistor. More particularly, the first surface zone on the first surface and the first surface zone on the second surface of the first body form a common or merged region or semiconductor material of the same dopant concentration.

48 Claims, 17 Drawing Figures

MERGED FIELD EFFECT TRANSISTOR CIRCUIT AND FABRICATION PROCESS

BACKGROUND OF THE INVENTION

The invention relates to semiconductor structures, and more particularly to three dimensional merged structures for implementing field effect transistor circuits.

Conventional MOS integrated circuits (often called "planar" devices) known in the prior art are characterized by the placement of the surfaces of the drain, source and channel active regions parallel to one of the flat major surfaces of the wafer or of the chip. The other flat major surface is usually used for mechanical fastening and electrical grounding of the chip to the package. Such device structures may be considered as "two dimensional" circuits, since no transistor device is placed perpendicular to the major surface which is subject to processing of MOS integrated circuit structure.

Vertical MOS (VMOS) structures known in the prior art adds the third dimension to the conventional MOS integrated circuits in that the plane defined by the surface of drain, source, and channel active regions forms an angle relative to the major surface of the wafer or of the chip utilized for processing, (i.e. a "V-groove" is formed on the major surface). The degree of the angle between the plane of the wafer and the plane formed by the MOS transistor surface depends upon the method of V-groove etching technology. Such devices may also be called "three dimensional" since the transistor structures utilize a penetration into the major silicon surface.

A vertical field effect transistor, such as described in U.S. Pat. No. 4,129,879, is also known which has a true "vertical" structure in which the current flow is essentially normal to the surface. Such a structure consists of a heavily doped semiconductor layer on which is formed a mesa structure including a moderately doped semiconductor layer and another heavily doped semiconductor layer, all of the layers being of the same conductivity type and with metallization on the external surfaces of the outer layers. Such a transistor is disclosed as having a Schottky gate junction on an insulated gate structure.

All of these prior art techniques provide individual devices, which must be interconnected by means of contacts and additional conducting materials like metal, polysilicon or highly doped semiconductor strips. More specifically constructing a gate or an amplifier or other circuit units. The output of the unit is always a highly doped semiconductor portion while the input is always a metal or polysilicon gate if transmission gates or grounded gate amplifiers are disregarded. The difference in material and in geometrical placement of the input and output requires at the minimum one contact to interconnect one device with another. A "contact" as used here means a direct mechanical surface-to-surface interface between metal or polysilicon and semiconductor. Such an interface is known to have a low, but not negligible, resistance, and a low potential barrier to the flow of mobile charge carriers. The contacts greatly enlarge the required silicon area for an MOS circuit, reduce reliability and operational speed.

Of less relevence, but which should be noted for completeness, are the merged bipolar transistor logic structures (also known as integrated injection logic or I²L) which are known in the prior art, such as exemplified by U.S. Pat. No. 4,056,810, issued Nov. 1, 1977. Although such prior art discloses multi-layer current injectors and purports to suggest their applicability to a "field effect transistor" (column 7, lines 25-26), the full characterization of such transistors including their structure and mode of operation, is nowhere suggested.

The structure and operation of current injector devices and planar, vertical, or merged bipolar transistors are totally different from unipolar or field effect transistors, and the teaching of the bipolar art is not generally applicable to the field of the present invention.

Although both vertical bipolar devices and vertical MOS devices are known in the prior art, there is no teaching from such art on how vertical field effect transistors may be connected together in a circuit, or used together with planar MOS devices in a merged form, in which the drain or source region together with a gate region constitutes a contactless unit. Thus, prior to the present invention, although there have been various implementations of bipolar and field effect transistors as two dimensional devices, there has been no teaching on how such devices may be implemented in three dimensions, and more particularly how circuits of more than one device may be interconnected without additional semiconductor structures.

SUMMARY OF THE INVENTION

Briefly, and in general terms, a three dimensional merged semiconductor structure is disclosed for implementing a field effect transistor circuit. The semiconductor structure is preferably implemented as a merged circuit in which one active zone of a first transistor and a second active zone of a second transistor form a common semiconductor region in three dimensions.

The presently disclosed semiconductor structure includes a first body of semiconductor material with first and second spaced apart surfaces, including a first surface zone of a first conductivity type and a first dopant concentration adjacent the first surface, a second surface zone of a second conductivity type and a second dopant concentration different from the first concentration adjacent the first surface and the first surface zone, and a third surface zone of the first conductivity type and the first dopant concentration adjacent the first surface and the second surface zone, the third surface zone being spaced apart from the first surface zone such that the second surface zone lies between the first and the third surface zones. The first and the second surface zones form respectively first and second active regions of a first transistor device, and the third surface zone forms a control region of the first transistor device. A fourth surface zone of the first conductivity type and the first dopant concentration is disposed adjacent the second surface, and directly connected with the third surface zone. There are further provided means for applying an electrical potential to the first and the third surface zones; and control means disposed adjacent the second surface zone for controlling the flow of current through the second surface zone.

The merged structure according to the present invention in which the output of a first circuit unit and the input of a second circuit unit of the circuit units are formed of the same semiconductor material reduces the silicon area, thereby increases circuit density, reliability and operational speed, as well as adds radiation hardness to the circuit by avoiding back-channel leakage.

BRIEF DESCRIPTION OF THE DRAWINGS

FIG. 2b is a schematic diagram of the semiconductor device illustrated in FIG. 2a;

FIG. 3b is a cross-sectional view of the semiconductor structure shown in FIG. 3a through the 3b—3b line shown in FIG. 3a;

FIG. 3c is a cross-sectional view of the semiconductor structure shown in FIG. 3a through the 3c—3c line shown in FIG. 3a;

FIG. 3d is an exploded perspective view of a portion of the semiconductor structure represented in FIG. 3a;

FIG. 3e is a schematic diagram of a circuit including a NAND gate as shown in FIG. 3a;

FIG. 4 shows a greatly simplified sequence of fabrication steps for producing n− channel three dimensional semiconductor device according to the present invention using an SOS type process, in particular;

DESCRIPTION OF THE PREFERRED EMBODIMENTS

Figure 1A:
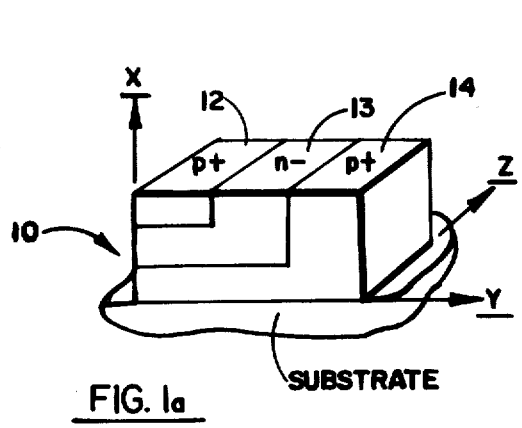
FIG. 1a is a perspective view of a body of semiconductor material used as a basic building block in the semiconductor devices and circuits according to the present invention.
Figure 1B:
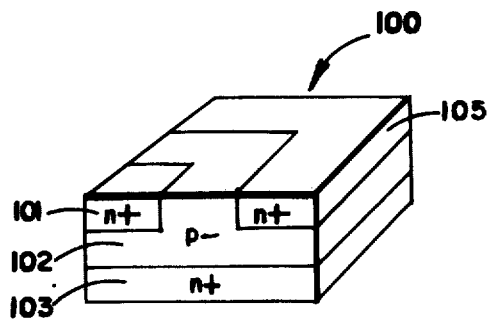
FIG. 1b is a second basic building block according to the present invention.

FIGS. 1a and 1b are a perspective view of discrete bodies of semiconductor material used as basic building blocks in the three dimensional semiconductor device according to the present invention. In the preferred embodiment according to the present invention, such a basic building block is a rectangular parallelopiped in which an insulated gate field effect transistor is implemented. It must be realized however that the present invention is not limited to the geometric configuration shown in the preferred embodiment, or the electronic structures associated with field effect transistors, since other geometric configurations and structures, and other transistor devices, including junction field effect transistors, bipolar devices, integrated injection logic devices, thyristors, and other structures could be implemented as well. Although the semiconductor material chosen in the exemplary embodiment is silicon, other semiconductor materials such as gallium arsenide or indium phosphide can be used as well.

The semiconductor bodies shown in FIG. 1 are illustrated separate and apart from the carrier or substrate upon which it is implemented since a variety of different structures may be used. One example to be considered later as a first embodiment is the implementation of the three dimensional structure on an insulating substrate such as sapphire. A second embodiment is one in which the three dimensional structure is implemented on bulk silicon, the structure taking the form of epitaxial layers on a major surface of the bulk silicon wafer.

FIG. 1a shows a first basic building block 10 of semiconductor material having zones of a first and a second conductivity type (e.g., p type and n type, respectively) disposed on an insulating substrate such as sapphire. More specifically, the body 10 consists of three layers or zones 12, 13, and 14 each of which have a predetermined substantially uniform dopant concentration or resistivity, and a predetermined conductivity type. In the preferred embodiment where the body 10 is originally of lightly doped n− type semiconductor material, the zone 12 is of heavily doped p+ type, the zone 13 is of lightly doped n− type, and the zone 14 is of heavily doped p+ type. In order to clarify the drawing, the p+ zones are labelled "p+" and the n− zone is labelled "n−". Such a convention is used in later drawings throughout the specification, although it is pointed out that such designations are broadly used to indicate regions of semiconductor material having different electrical properties, and such designations are not intended to limit the invention to merely changes in dopant concentration or conductivity type.

Although FIG. 1a shows three layers of alternating conductivity type, such a choice is merely for simplicity. The building block shown in FIG. 1a is only one of a variety of configurations that can be used. Moreover, although the building block 10 shown in FIG. 1a has uniform dopant concentration in the Z direction, other building blocks may have a structure which differs in the Z direction, as shown in FIG. 1b for example.

Note the convention used for labelling the bodies of semiconductor material and the zones therein. A body of semiconductor material which form p-channel devices is labelled by a multiple of 10, that is 10, 20, 30, and 20 on. As we shall see later, an n-channel FET will be formed from such body. A body of semiconductor material which form n-channel devices labelled by a multiple of 100, that is 100, 200, 300, and so on. A p-channel FET will be formed from such body. The zones within each body of semiconductor material are labelled by unit increments within that power of 10 or 100. In the case of the body in FIG. 1a, the zones are labelled 11, 12, and 13, while in the body of FIG. 1b the subregions are labelled 101, 102, 103, and so on. Such a convention should enable the reader to more easily determine at a glance the nature of the original block of semiconductor material. Another convention used is illustrated in FIGS. 1a and 1b in which zones of the same conductivity, such as p− type are designated by reference numerals having the same parity, for example, being "even" parity. In the case of FIGS. 1a and 1b, the regions of n-type concentration are all designated by odd reference numerals, such as 13 in FIG. 1a, 101, 103 and 105 in FIG. 1b. The regions of p-type conductivity are all designated by even numerals, for example 12 and 14 in FIG. 1a, and 102 in FIG. 1b.

In FIG. 1b the zones 101, 103 and 105 are heavily doped n+ type while 102 is a lightly doped p− type zone.

Figure 2A:
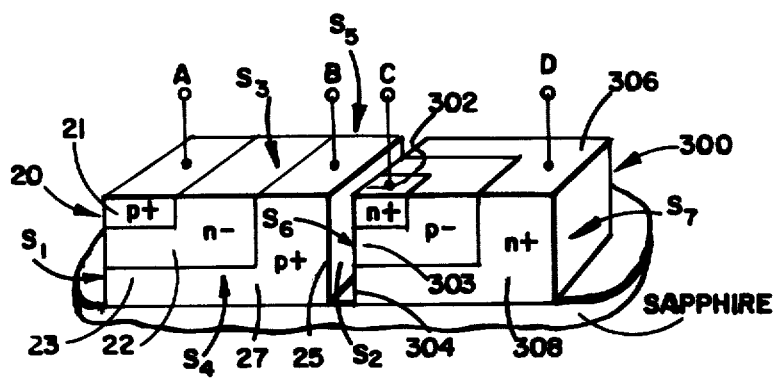
FIG. 2a is a perspective view of how two basic building blocks may be combined together to form a 3-dimensional semiconductor structure for implementing an insulated gate field effect transistor structure in which the electrode of one FET is merged with the electrode of the second FET in a common semiconductor region.

FIG. 2a is a perspective view of the combination of two basic building blocks of semiconductor material to form a three dimensional semiconductor structure for implementing an insulated gate field effect transistor according to the present invention. In the present example both blocks 20 and 300 are originally of different conductivity types, and each body contains discrete regions or zones of different dopant concentration. It must be realized again that the present invention is not intended to be limited to the particular electronic structures shown in the present example. The two bodies may originally be of the same or of different semiconductor material, originally be of the same or of different conductivity type, and the discrete zones therein may be defined by different electrical properties other than the dopant concentration or conductivity type.

Although FIG. 2a only incorporates two basic building blocks, such an embodiment illustrates the basic principle of the merged structure of two insulated gate field effect transistors according to the present invention. The figure shows a first and second body of semiconductor material having the basic geometrical composition of the building block shown in FIG. 1a, and disposed adjacent one another on a substrate of insulating material such as sapphire. The building blocks 20 and 300 are separated by a dielectric layer approximately 1000 Angstroms in thickness. The first body 20 of semiconductor material has first $S_1$ and second $S_2$ spaced apart surfaces, including a first surface zone 21 of a first conductivity type and a first dopant concentration adjacent the first surface $S_1$, a second surface zone 22 of a second conductivity type and a second dopant concentration adjacent the first surface $S_1$ and the first surface zone 21, and a third surface zone 23 of the first conductivity type and the first dopant concentration adjacent the first surface $S_1$ and the second surface zone 22, the third surface zone 23 being spaced apart from the first surface zone 21 such that the second surface zone 22 lies between the first and the third surface zones 21 and 23 respectively. A fourth surface zone 25 of the first conductivity type and the first dopant concentration is further provided adjacent the second surface $S_2$ which is directly connected with the third surface zone 23 via the semiconductor body portion 27. It is further noted that since the surface zones 23 and 25 as well as the semiconductor body portion 27 are of the same conductivity type and dopant concentration, the semiconductor regions 23, 25, and 27 form a common semiconductor zone or region.

The second body 300 of semiconductor material has first $S_6$ and second $S_7$ spaced apart surfaces, including a first surface zone 302 of a second conductivity type and a first dopant concentration adjacent said first surface $S_6$, a second surface zone 303 of the first conductivity type and a second dopant concentration adjacent said first surface $S_6$ and said first surface zone 302, and a third surface zone 304 of the second conductivity type and the first dopant concentration adjacent said first surface $S_6$ and said second surface zone 302, said third surface zone 304 being spaced apart from said first surface zone 302 such that said second surface zone 303 lies between said first and said third surface zones. A fourth surface zone 306 of the second conductivity type and the first dopant concentration is provided adjacent said second surface $S_7$, and directly connected with said third surface zone 304 via the semiconductor body portion 308. It is similarly noted that since the surface zones 304 and 306, as well as that of the semiconductor body portion 308, are of the same dopant concentration, the semiconductor regions 304, 306, and 308 form a common semiconductor zone or region.

In the exemplary embodiment of FIG. 2a, the surface zones 21, 22, and 23 adjacent the surface $S_1$ of the body 10 form the source, channel, and drain regions of the first transistor device $Q_1$. More particularly, the transistor device is a field effect transistor $Q_1$ in which the source, channel, and drain regions are formed by zones 21, 22, and 23 respectively. The gate electrode of field effect transistor $Q_1$ is adjacent the channel region, and can be formed by a portion of an adjacent body of semiconductor material (not shown) on the sides $S_1$, $S_4$, and $S_5$ or as a two dimensional planar device on side $S_3$ by a metal or silicon gate isolated by oxide. In order for the structure to function as a field effect transistor, there must be first and secnd sources of electrical potential, such as a first source of relative positive and a second source of relative negative voltage applied to the source and drain region. The first source of potential A is applied, for example, to the surface zone 21 but the second source of potential B is applied to the third surface zone 23.

Similarly, in the exemplary embodiment of FIG. 2a, the second insulated gate field effect transistor $Q_2$ is formed by the surface zone 25 on the first body 20 as a gate or control electrode and by zones 302, 303, and 304 respectively as source, channel, and drain regions respectively. In order for the structure to function as a field effect transistor, there must be first and second sources of electrical potential, such as a first source of relative positive potential and a second source of relative negative potential, applied to the source and drain regions of the transistor. The first source of electrical potential C is applied to the first surface zone 302 and the second source of potential D is applied to the surface zone 304 (through zone 306). When an input signal is applied to the gate electrode, the surface zone 25, the device $Q_2$ operates as a field effect transistor.

Electrodes A, B, C, and D are shown in a highly diagrammatic manner connected to zones 21, 25, 302, and 306 respectively. Such electrodes apply an appropriate potential to the corresponding zones. The drain and source regions 21 and 23 (25) of device 10 or 302 and 304 (306) of device 300 are interchangeable since such devices are electrically unipolar as all field effect transistor devices are. Either the source or the drain could be merged into a gate electrode depending upon the structure and the desired operation of the circuit.

Figure 2B:
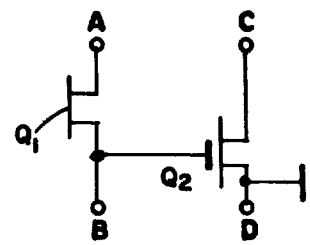

FIG. 2b is a schematic diagram of the circuit of the semiconductor device shown in FIG. 2a. There is shown a first field effect transistor $Q_1$ having one conduction path terminal connected to a terminal A and its second conduction path electrode connected to a terminal B. A second field effect transistor $Q_2$ is also provided having one conduction path electrode connected to a terminal C and its second conduction path electrode connected to terminal D. The gate or control electrode of field effect transistor Q$_2$ is connected to terminal B. Such a source-to-gate connection of two FETs is a prototype circuit block for many more complex circuits.

Figure 3B:
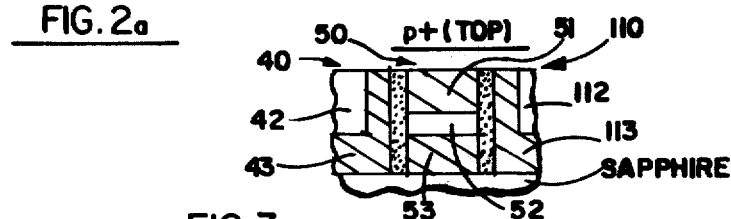
Figures 3A, 3C:
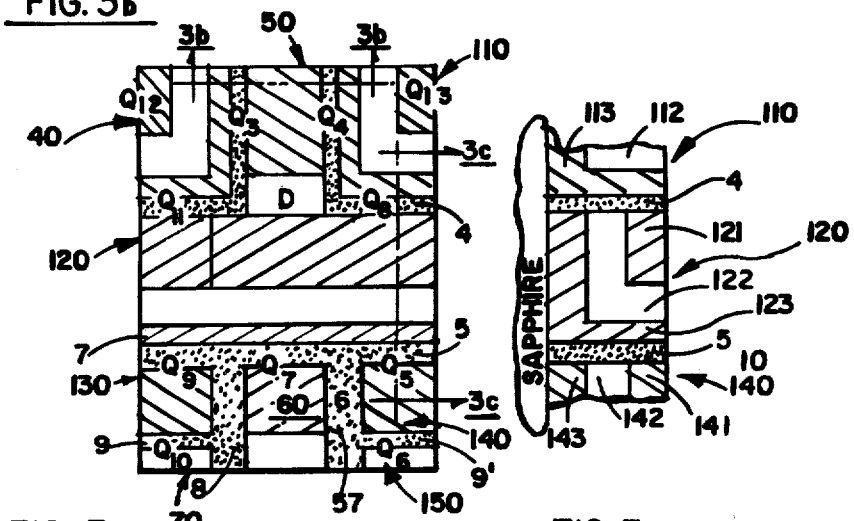
Figure 3A:
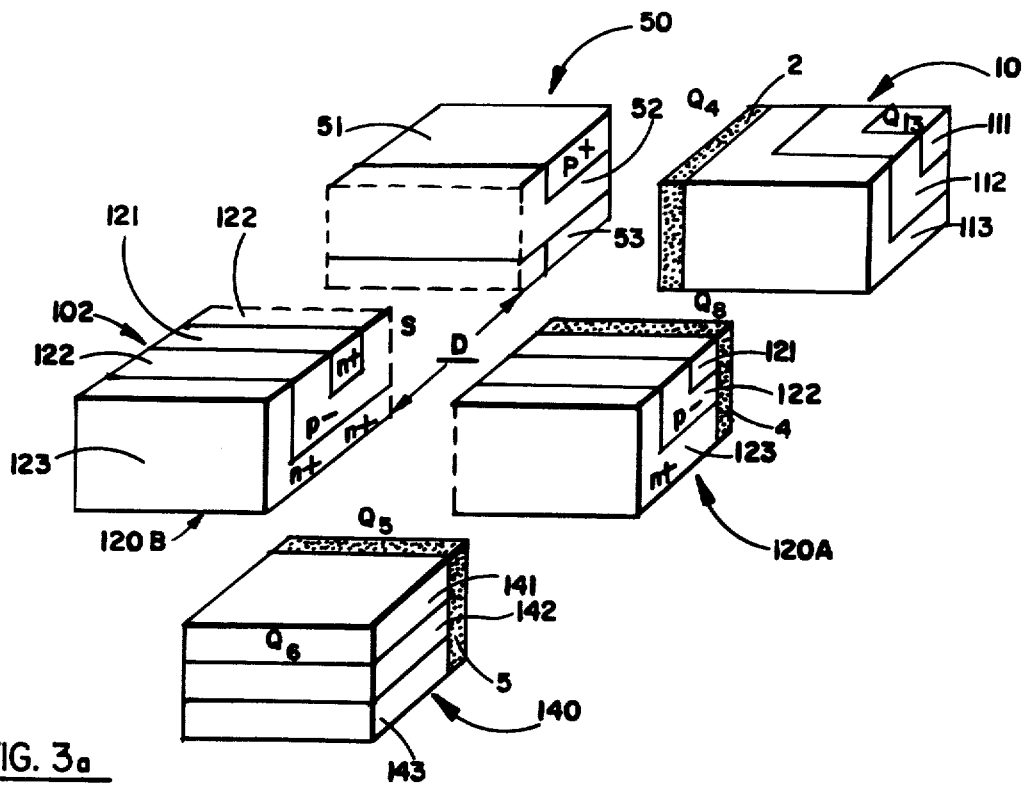
FIG. 3a is a plan view of the circuit including a NAND gate implemented in a semiconductor structure according to the present invention.

FIG. 3a is a plan view of a semiconductor device for implementing a NAND logical function in a three dimensional semiconductor structure according to the present invention. In the plan view, bodies of n and p conductivity type with different dopant concentration are shown, as well as the oxide regions, gate oxide and field oxide. Because of the complexity of the three dimensional structure according to the present invention, the contact layer which makes electrical contact with the semiconductor zones is not shown. However, implementation of such a contact layer is suggested later from FIG. 4e.

The convention used in the plan view is that a region of p+ type conductivity is indicated by cross-hatching going from left-to-right, top-to-bottom, and a region of n+ type conductivity is indicated by cross-hatching going from right-to-left, top-to-bottom. Regions of either p-type or n-type are not cross-hatched. The reader should be able to determine the conductivity type of a region that is not cross-hatched since it is the opposite conductivity type of the adjacent zones in the same body.

Turning now to the plan view shown in FIG. 3a there are shown five bodies or blocks of semiconductor material 40, 50, 60, 70 and 80 which form p-channel transistors in the circuit according to the present invention. There are also five bodies or blocks of semiconductor material 110, 120, 130, 140 and 150, which form n-channel transistors. These bodies of semiconductor material are preferably silicon, and preferably are disposed on a sapphire substrate in the same manner shown in FIG. 1. The bodies of semiconductor material are further separated from each other by dielectric or insulating regions 1, 2, 3, 4, 5, 6, 7, 8 and 8', or 9 and 9'. Bodies 50 and 120 are not separated, but are in direct physical and electrical contact along a surface D which forms a diode.

Field effect transistors are formed when a gate electrode constituted by a surface zone of one body is adjacent a channel region constituted by a surface zone of another body with a thin dielectric layer therebetween. In the circuit shown in FIG. 3a, the FETs Q$_3$–Q$_{13}$ are formed in such manner. P-channel FET Q$_3$ is formed between blocks 40 and 50; the gate electrode is formed by the adjacent surface zones in block 40, and the channel region is formed by an adjacent surface zone in block 50. Similarly, p-channel FET Q$_4$ is formed between blocks 50 and 110, p-channel FET Q$_5$ is formed between blocks 120 and 140, p-channel FET Q$_6$ is formed between blocks 140 and 150, n-channel FET Q$_7$ is formed between blocks 120 and 60, n-channel FET Q$_8$ is formed between blocks 40 and 120, p-channel FET Q$_9$ is formed between blocks 120 and 130, p-channel FET Q$_{10}$ is formed between blocks 130 and 180, n-channel FET Q$_{11}$ is formed between blocks 110 and 120, p-channel FET Q$_{12}$ is formed between block 40 and an adjacent body of semiconductor material (not shown), and n-channel FET Q$_{13}$ is formed between blocks 110 and adjacent body of semiconductor material (not shown).

There is no dielectric layer between bodies 50 and a projecting portion of zone 122 of body 120. Since the surface zones 53 and 123 of bodies 50 and 120 respectively are of opposite conductivity type, a diode D is formed between the contiguous surface zone 53 of body 50 and surface zone 123 of body 120.

In order to further clarify the circuit illustrated in FIG. 3a, FIG. 3b shows a cross-sectional view through the b—b plane in FIG. 3a, and FIG. 3c shows a cross-sectional view through the c—c plane in FIG. 3a.

Turning now to FIG. 3b, it is noted that body 50 is disposed upon the sapphire substrate and is composed of three layers 51, 52 and 53 respectively from the top surface to the sapphire substrate. Adjacent to the body 50 are the bodies 40 and 110. A portion of the cross-section of body 40 is shown illustrating two zones or layers 42 and 53. The layer 43 forms a surface zone adjacent the surface of body 50. Separating bodies 40 and 50 is a thin dielectric layer 3 of insulating material of a predetermined thickness which functions so that the layer 43 forms a gate electrode over the source, channel, and drain regions 51, 52, and 53 of body 50. In the preferred embodiment, the thickness of the dielectric layer 3 is.

Adjacent to the body 50 on the right side is the body 110. A portion of the cross-section of body 110 is shown which illustrates zones 112 and 113. The zone 113 forms a surface zone which is adjacent one of the surfaces of body 50. The surface zone 113 is separated from the surface of body 50 by a thin dielectric layer 2 which functions so that the zone 113 forms a gate electrode over the source, channel, and drain electrodes of body 50.

FIG. 3c shows a cross-sectional view through the CC plane in FIG. 3a. Body 120 is seen to consist of three zones 121, 122, and 123 of n+, p−, and n+ conductivity respectively. The zone 123 lies on the sapphire substrate, and portions of the zones 121, 122 and 123 appear on the top surface of the semiconductor body 120. Adjacent body 120 are bodies 110 and 140. A portion of the cross-section of body 110 is shown to consist of two zones 112 and 113, of p− and n+ conductivity, respectively. The zone 113 is adjacent the surface of body 120 and separated therefrom by a thin dielectric layer 4.

The zone 113 of body 110 forms a gate electrode of an n-channel FET Q$_{11}$ which is formed between bodies 110 and 120. Zones 121, 122 and 123 therefore form the source, channel and drain regions of FET Q$_{11}$.

Body 120 is also adjacent a surface of body 140, a portion of which is shown in cross-section and separated therefrom by a thin dielectric layer 5. The body 140 is seen to consist of three zones, 141, 142, and 143 respectively from the top surface to the sapphire substrate. Each of these zones are adjacent the zone 123 of body 120. The zones 141, 142 and 143 form the source, channel, and drain regions of a p-channel FET Q$_5$ in which the zone 123 of body 120 forms the gate electrode.

FIG. 3d is an exploded perspective view of a portion of the semiconductor device shown in FIG. 3a, showing the bodies of semiconductor material 50, 110, 120 and 140. Body 110 is seen to consist of three zones 111, 112, and 113. Body 50 is seen to be composed of three zones 51, 52, and 53. Body 120 is broken up into two parts, 120A and 120B, for simplicity. The first part 120A is seen to consist of zones 121, 122, and 123; and the second part 120B is also seen to consist of the zones 121, 122, and 123, but in this part the zone 122 takes a different geometric configuration and extends along the surface S of one side of the body 120B so as to make contact with the layer 52 of body 50. Since zone 123 is of n+ type conductivity, and zone 53 is of p+ type conductivity the junction between the surface of zone 123 and the corresponding surface of the zone 53 of body 50 forms a diode D, shown in the schematic diagram of FIG. 3e, and labelled D in the plan view of FIG. 3a.

Body 140 is also shown to consist of three zones 141, 142, and 143 which form parallel layers in the body.

The dielectric layers 2, 4, and 5 are also shown in FIG. 3d as is suggested from FIG. 3a.

Figure 3E:
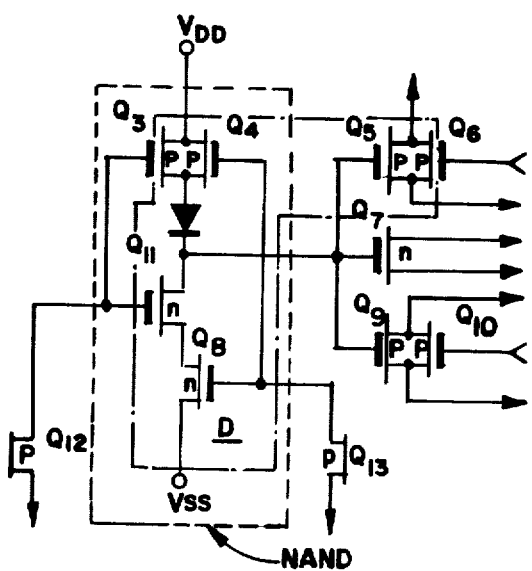

FIG. 3e is a schematic diagram of the circuit as implemented in the layout drawing of 3a-3c. In this drawing the corresponding MOSFETs $Q_3 \geq Q_{13}$ are labelled corresponding to the MOSFETs shown and labelled $Q_3-Q_{13}$ in FIG. 3a.

It should also be pointed out that while three-layer bodies are used in the described embodiment, four-layer bodies, such as p+, $\pi$, n−, p+ could be used as well. The incorporation of the more heavily doped $\pi$ layer adjacent the n− layer functions to increase break-down voltage, control channel length of extreme short dimensions, assure proper saturation characteristics, and decrease drain-source leakage currents.

The present invention is also concerned with the fabrication process or method of making a three dimensional merged field effect transistor device according to the present invention.

Turning now more specifically to FIG. 4, comprised of FIGS. 4a through 4e, a greatly simplified sequence of fabrication steps for producing the n-channel merged three dimensional semiconductor device according to the present invention using a silicon-on-sapphire (SOS) type process is disclosed. Although the SOS type process is used by way of example, the present invention is not intended to be limited to such, and similar merged three dimensional semiconductor devices may be produced using the bulk silicon or other processes as well. Of course p-channel devices can be fabricated with the same processing method, using p+ doped material for drain and source and n− doped material for the channel regions. By means of additional ion implantation or diffusion step or steps complementary structures can be fabricated corresponding to the circuit shown on FIG. 3. The process' step sequences, equipment used, and operating procedures can be changed depending upon the particular configuration, but general description serves the prupose of defining the basic fabrication methods of forming a merged three dimensional device structure.

The basic process begins with a substrate of insulating material, such as sapphire. A first layer of semiconductor material of a first conductivity type and a first dopant concentration is deposited on such substrate. Alternatively one may begin with a bulk silicon wafer and prepare a suitable body of semiconductor material in such wafer. In either case the first basic step is to prepare a body of semiconductor material consisting of a first layer of semiconductor material of a first conductivity type and a first dopant concentration, a second layer of semiconductor material of the first conductivity type and the first dopant concentration spaced apart from the first layer, and a third layer of semiconductor material of a second conductivity type and a second dopant concentration interposed between the first and the second layers in a sandwich structure.

One method of forming such a sandwich structure is to deposit a first dopant species in the first layer of semiconductor material deposited on the sapphire substrate for forming a second layer of semiconductor material therein of a different conductivity type and a different dopant concentration. A second dopant species is then deposited in either the first or the second layer for forming yet a third layer of semiconductor material of a different conductivity type and dopant concentration. Alternatively such structures may also be fabricated by epitaxial deposition.

Figure 4A:
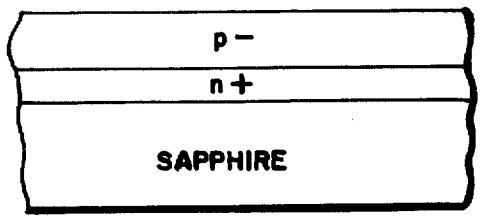
FIG. 4a shows the starting structure of p− and n+ silicon layers on a sapphire substrate.

FIG. 4a shows an example of one possible basic sandwich structure from which the method according to the present invention may proceed. The basic sandwich structure shown in the FIGURE consists of a silicon-on-sapphire structure. The silicon portion in the illustrated example contains an upper p− conductivity type layer and a lower n+ conductivity type layer. Such a structure may be fabricated by either epitaxial deposition or ion implantation or by variations of both methods according to procedures known to those skilled in the art.

Figure 4B:
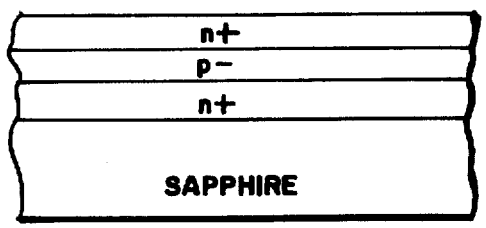
FIG. 4b shows the ion implantation from the topside step for forming n+ regions for the drains and sources of other devices.

FIG. 4b shows the modified semiconductor structure derived from the semiconductor structure in FIG. 4a after ion implantation from the topside takes place. The ion implantation step forms n+ regions on the top major surface of the semiconductor body for ultimate formation of the drains and sources of n channel field effect transistor devices.

Subsequent to the ion implantation step from the topside, ion milling or plasma or other type of etching is performed on the body of semiconductor material for forming a plurality of mutually separated body portions. Each of the body portions 400, 500, 600, and 700 so formed form the basic building blocks of the merged three dimensional semiconductor device according to the present invention. Each of the body portions incorporate a portion of each of the n+, p−, and n+ original layers of the original body of semiconductor material.

Figure 4C:
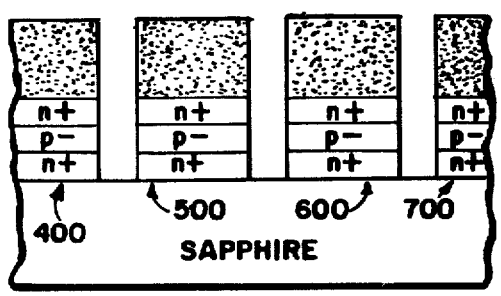
FIG. 4c shows the ion milling step for defining a gate dielectric region and regions separating the bodies of semiconductor material.

The particular size and geometric configuration of the mutually separated body portions are defined by a mask. The mask for defining such a pattern can be either in direct contact with the silicon-on-sapphire (SOS) material or may be a projected mask (contactless). Following such definition of the mutually separated body portions, an oxide layer is grown on the top of each of the semiconductor body portions as shown in FIG. 4c. Such an oxide layer is formed by conventional processing and functions to overcome undesired effects caused by processing according to the present invention.

Subsequent to the ion milling and oxide growing step shown in FIG. 4c, a deep ion implantation step takes place for forming the vertical gates 401 and 601 which merge into the drain or source of the n channel device formed in the respective body portion 400 and 600.

Since the drain or source in such body portions is a low resistivity n+ type material, the merging gate should have the same n+ type doping concentration after the ion implantation in order to provide a low resistance galvanic interconnection between the gate and the drain or the source.

Figure 4D:
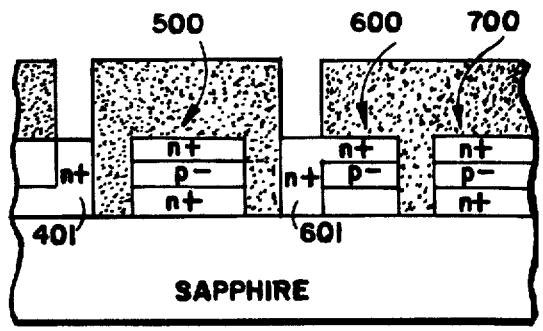
FIG. 4d shows a first deep ion implantation step for the purpose of adjusting resistivities and junction depths to required values in a first portion.

In FIG. 4d windows are shown cut in the oxide above the regions where the deep ion implantation is subsequently performed. The formation of such windows can be done by any one of several known methods in the art, and therefore need not be described in detail here.

Figure 4E:
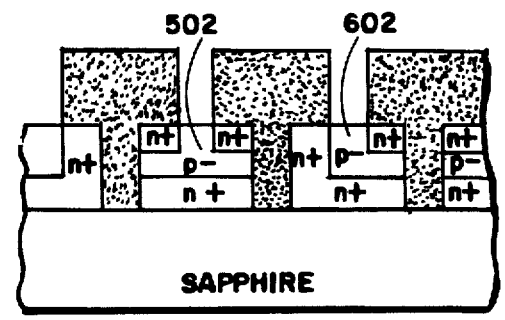
FIG. 4e shows a second ion implantation step for the purpose of adjusting resistivities and junction depths to required values in a second portion.

FIG. 4e shows a second ion implantation step in regions 502 and 602 for the purpose of separating gates from sources or drains, or separating drains from drains or source from sources in order to form the merged n− channel device structure. Again windows are shown cut in the oxide above the region of subsequent ion implantation.

The specific details of the techniques of crystal-epitaxial growing methods, diffusion, ion implantation, wet and dry etching procedures (including ion milling and plasma-etching), oxide growing, pejrolic, reflow, metal-deposition, sputtering, lift off, and so on are not described herein since such processes are known in the prior art.

Figure 5:
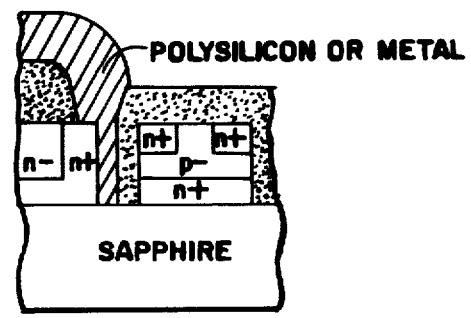
FIG. 5 shows another embodiment of the present invention using polysilicon or metal gates which simultaneously provides a contact for a long interconnection path.

FIG. 5 is another embodiment of the present invention to simplify device fabrication. The FIGURE shows the substitution of a polysilicon or metal gate for a semiconductor region which forms a gate electrode in the three dimensional structure. Such polysilicon or metal gate can also provide contact for a long interconnection which extends over the field oxide or other insulator.

Figure 6:
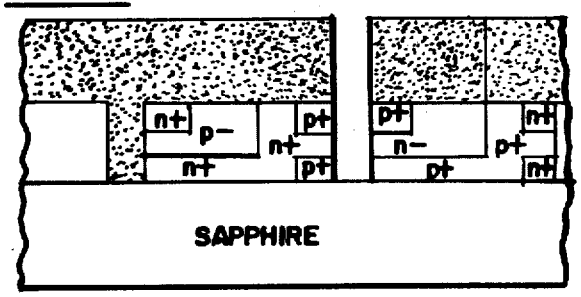
FIG. 6 shows another embodiment of the present invention, a self-aligning structure for fabricating the three dimensional semiconductor structure according to the present invention.

FIG. 6 shows another embodiment of the present invention in which the basic semiconductor body portions form a self-aligning structure. Such a structure reduces the actual gate length and sets it equal to the length of the channel region. Such a self-aligned structure is produced by suitable p+ or n+ masks.

Figure 7:
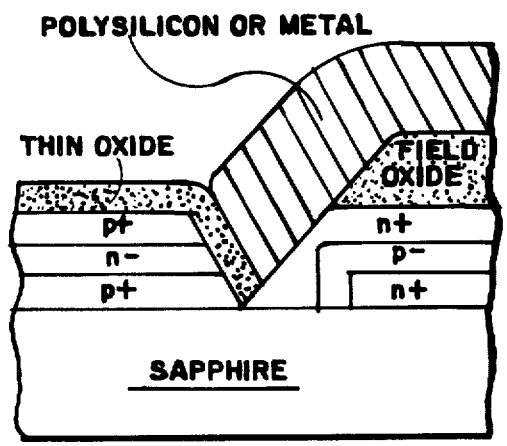
FIG. 7 shows another embodiment of the present invention incorporating not only purely vertical but angled structures as well.

FIG. 7 illustrates another embodiment of the present invention incorporating not only vertical but other different angles equally suitable to fabricate merged structures.

It will be obvious to those skilled in the art that the semiconductor device according to the present invention can be manufactured with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, may be used. Furthermore, the conductivity types in the embodiment may be interchanged and corresponding to which, the polarity of the operating voltages are to be adapted. Moreover, the voltage level and the static or dynamic nature of the signals applied to the various terminals and gates of the device, as well as the voltage sources, may be suitably selected as desired for a particular application.

Having thus set forth a preferred embodiment of the invention, what is claimed is:

1. A semiconductor device comprising:
    a first body of semiconductor material having first and second spaced apart surfaces, including a first surface zone of a first conductivity type and a first dopant concentration adjacent said first surface, a second surface zone of a second conductivity type and a second dopant concentration different from said first concentration adjacent said first surface and said first surface zone, and a third surface zone of said first conductivity type and said first dopant concentration adjacent said first surface and said second surface zone, said third surface zone being spaced apart from said first surface zone such that said second surface zone lies between said first and said third surface zones; said first and said second surface zones forming respectively first and second active regions of a first transistor device, and said second surface zone forming a control region of said first transistor device; a fourth surface zone of said first conductivity type and said first dopant concentration formed in said first body, said fourth surface zone being disposed adjacent said second surface, and directly connected with said third surface zone through a semiconductor body portion of said first body;

means for applying an electrical potential to said first and said third surface zones; and control means disposed adjacent said second surface zone for controlling the flow of current through said second surface zone.

2. A semiconductor device as defined in claim 1 further comprising:
    a dielectric layer disposed on at least a portion of said second surface zone lying between said first and said third surface zones; said control means being disposed contiguous to said dielectric layer.

3. A semiconductor device as defined in claim 2 wherein said semiconductor material is silicon, and said dielectric layer is composed of silicon dioxide.

4. A semiconductor device as defined in claim 1 wherein said control means comprises a conductive gate electrode functioning to create a field in said second surface zone.

5. A semiconductor device as defined in claim 1 wherein said transistor device is an insulated gate field effect transistor.

6. A semiconductor device as defined in claim 1 wherein said first body of semiconductor material is disposed on a layer of insulating material.

7. A semiconductor device as defined in claim 6 wherein said layer of insulating material is a sapphire substrate.

8. A semiconductor device as defined in claim 1 wherein said first body of semiconductor material is disposed on a silicon substrate.

9. A semiconductor device as defined in claim 1 wherein said control means comprises a second body of semiconductor material having a controllable electrical potential.

10. A semiconductor device as defined in claim 1, wherein said first surface zone includes spaced apart first and second portion adjacent said first surface, said second surface zone including a third portion adjacent said first surface and disposed between said first and said second portions.

11. A semiconductor device as defined in claim 1, further comprising:
    a fifth surface zone of said second conductivity type and said second dopant concentration adjacent said second surface and said fourth surface zone, and directly connected with said second surface zone; and a sixth surface zone of said first conductivity type and said first dopant concentration adjacent said second surface and said fifth surface zone and directly connected with said third surface zone, said sixth surface zone being spaced apart from said fourth surface zone such that said fifth surface zone lies between said fourth and said sixth surface zones.

12. A semiconductor device as defined in claim 1, further comprising:

a second body of semiconductor material having a first surface, and a second spaced apart surface disposed adjacent said first body, said second body including a first surface zone of said first conductivity type and said first dopant concentration adjacent said first surface, a second surface zone of said second conductivity type and said second dopant concentration adjacent said first surface and said first surface zone, and a third surface zone of said first conductivity type and said first dopant concentration adjacent said first surface and said second surface zone, said third surface zone being spaced apart from said first surface zone such that said second surface zone lies between said first and said third surface zones;

and wherein said control means comprises a fourth surface zone of said second body of said first conductivity type and said first dopant concentration adjacent said second surface of said second body and directly connected with said third surface zone of said second body.

13. A semiconductor device as defined in claim 12, wherein said first and said second surface zones of said second body form respectively first and second active regions of a second transistor device.

14. A semiconductor device as defined in claim 12, wherein said second body further comprises a third surface contiguous with and at least in part disposed between said first and said second surfaces.

15. A semiconductor device as defined in claim 14, wherein said third surface comprises a first surface zone of said first conductivity type and said first dopant concentration adjacent said third surface, a second surface zone of said second conductivity type and said second dopant concentration adjacent said third surface and said first surface zone of said third surface, and a third surface zone of said first conductivity type and said first dopant concentration adjacent said third surface and said second surface zone, said third surface being spaced apart from said first surface zone such that said second surface zone lies between said first and said third surface zones.

16. A semiconductor device as defined in claim 15, wherein said third surface comprises at least a first edge and a second edge, said first surface zone of said third surface including at least a portion of said first edge and said second edge.

17. A semiconductor device as defined in claim 16, wherein said first edge separates said third surface from said second surface.

18. A semiconductor device as defined in claim 17, wherein said second edge separates said third surface from said first surface.

19. A semiconductor device as defined in claim 18, wherein said first edge and said second edge meet in a point, and said first and said second surfaces meet along a line.

20. A semiconductor device as defined in claim 1, further comprising:
a second body of semiconductor material having a first surface, and a second spaced apart surface disposed adjacent said first body, said second body including a first surface zone of said second conductivity type and a first dopant concentration adjacent said first surface, a second surface zone of said first conductivity type and a second dopant concentration adjacent said first surface and said first surface zone, and a third surface zone of said second conductivity type and said first dopant concentration adjacent said first surface and said second surface zone, said third surface zone being spaced apart from said first surface zone such that said second surface zone lies between said first and said third surface zones;

and wherein said control means comprises a fourth surface zone of said second body of said second conductivity type and said first dopant concentration adjacent said second surface of said second body and directly connected with said third surface zone of said second body.

21. A semiconductor device as defined in claim 20, wherein said first and said second surface zones of said second body form respectively first and second active regions of a second transistor device.

22. A semiconductor device as defined in claim 20, wherein said second body further comprises a third surface contiguous with and at least in part disposed between said first and said second surfaces.

23. A semiconductor device as defined in claim 22, wherein said third surface comprises a first surface zone of said second conductivity type and said first dopant concentration adjacent said third surface, a second surface zone of said first conductivity type and said second dopant concentration adjacent said third surface and said first surface zone of said third surface, and a third surface zone of said second conductivity type and said first dopant concentration adjacent said third surface and said second surface zone, said third surface being spaced apart from said first surface zone such that said second surface zone lies between said first and said third surface zones.

24. A semiconductor device as defined in claim 23, wherein said third surface comprises at least a first edge and a second edge, said first surface zone of said third surface including at least a portion of said first edge and said second edge.

25. A semiconductor device as defined in claim 24, wherein said first edge separates said third surface from said second surface.

26. A semiconductor device as defined in claim 25, wherein said second edge separates said third surface from said first surface.

27. A semiconductor device as defined in claim 26, wherein said first edge and said second edge meet in a point, and said first and said second surfaces meet along a line.

28. A semiconductor device as defined in claim 12, further comprising:
a third body of semiconductor material having a first surface and a second spaced apart surface disposed adjacent said first surface of said second body, said third body including a first surface zone of said first conductivity type and a first dopant concentration adjacent said first surface, a second surface zone of said second conductivity type and a second dopant concentration adjacent said first surface and said first surface zone, and a third surface zone of said first conductivity type and said first dopant concentration adjacent said first surface and said second surface zone, said third surface zone being spaced apart from said first surface zone such that said second surface zone lies between said first and said third surface zones; a fourth surface zone of said first conductivity type and said first dopant concentration adjacent said second surface, and directly connected with said third surface zone.

29. A semiconductor device as defined in claim 12, further comprising:
a third body of semiconductor material having a first surface and a second spaced apart surface disposed adjacent said first surface of said second body, said third body including a first surface zone of said second conductivity type and a first dopant concentration adjacent said first surface, a second surface zone of said first conductivity type and a second dopant concentration adjacent said first surface and said first surface zone, and a third surface zone of said second conductivity type and said first dopant concentration adjacent said first surface and said second surface zone, said third surface zone being spaced apart from said first surface zone such that said second surface zone lies between said first and said third surface zones; a fourth surface zone of said second conductivity type and said first dopant concentration adjacent said second surface, and directly connected with said third surface zone.

30. A semiconductor device as defined in claim 20, further comprising:
a third body of semiconductor material having a first surface and a second spaced apart surface disposed adjacent said first surface of said second body, said third body including a first surface zone of said first conductivity type and a first dopant concentration adjacent said first surface, a second surface zone of said second conductivity type and a second dopant concentration adjacent said first surface and said first surface zone, and a third surface zone of said first conductivity type and said first dopant concentration adjacent said first surface and said second surface zone, said third surface zone being spaced apart from said first surface zone such that said second surface zone lines between said first and said third surface zones; a fourth surface zone of said first conductivity type and said first dopant concentration adjacent said second surface, and directly connected with said third surface zone.

31. A semiconductor device as defined in claim 20, further comprising:
a third body of semiconductor material having a first surface and a second spaced apart surface disposed adjacent said first surface of said second body, said third body including a first surface zone of said second conductivity type and a first dopant concentration adjacent said first surface, a second surface zone of said first conductivity type and a second dopant concentration adjacent said first surface and said first surface zone, and a third surface zone of said second conductivity type and said first dopant concentration adjacent said first surface and said second surface zone, said third surface zone being spaced apart from said first surface zone such that said second surface zone lies between said first and said third surface zones; a fourth surface zone of said second conductivity type and said first dopant concentration adjacent said second surface, and directly connected with said third surface zone.

32. A semiconductor device comprising:
a substrate;
a plurality of bodies of semiconductor material disposed on said substrate mutually separated and electrically isolated by a region of dielectric material, a first one of said bodies including a first surface overlying and in contact with said substrate and a substantially planar second surface connected to said first surface along an edge of said first body lying on said substrate, said second surface extending from said first surface in a direction away from said substrate, said second surface including a first surface zone of a first conductivity type and a first dopant concentration, a second surface zone of a second conductivity type and a second dopant concentration, and a third surface zone of said first conductivity type and said first dopant concentration, said surface zones forming the source, channel, and drain regions of a first field effect transistor, and means connected to said source and drain regions for applying an electrical potential thereto.

33. A semiconductor device as defined in claim 32 wherein each of said bodies includes a third surface extending from said first surface, said third surface including a first surface zone forming the gate electrode of a second field effect transistor implemented on an adjacent second one of said bodies.

34. A semiconductor device as defined in claim 32 wherein said first surface zone of said third surface is directly electrically connected with one of said surface zones of said second surface.

35. A semiconductor device as defined in claim 32 wherein said substrate is composed of sapphire.

36. A method of making a semiconductor device comprising the steps of:
preparing a region of semiconductor material comprising a first layer of semiconductor material of a first conductivity type and a first dopant concentration, a second layer of semiconductor material of said first conductivity and said first dopant concentration spaced apart from said first layer, and a third layer of semiconductor material of said second conductivity type and a second dopant concentration interposed between said first and said second layers;
etching said region of semiconductor material to form a plurality of mutually separated bodies of semiconductor material, each of said bodies incorporating a portion of each of said three layers of semiconductor material;
depositing a first dopant species in a first portion of one of said bodies said first portion including a portion of at least two of said layers in said body prior to said depositing step; so that after said depositing step said first portion has a single substantially uniform conductivity type and dopant concentration substantially the same as that of a first one of said layers of semiconductor material of said one body;
forming a region of dielectric material between ones of said mutually separated bodies;
providing means for applying an electrical potential to at least two of said layers of semiconductor material.

37. A method as defined in claim 36 further comprising the step of:
depositing a second dopant species in a second portion of said one of said bodies so that said second portion has a conductivity type and dopant concentration substantially the same as that of one of said layers of semiconductor material, said second portion including a portion of at least two of said layers in said body prior to said depositing step.

38. A method as defined in claim 36 wherein said step of etching comprises dry etching said region of semiconductor material to form a plurality of substantially rectangular parallelopiped bodies of semiconductor material.

39. A method as defined in claim 36 wherein said step of depositing a first dopant species separates said one body portion into three zones of alternating conductivity type.

40. A method as defined in claim 39 wherein said three zones are n+, p−, and n+, and form the source, channel, and drain regions of a first field effect transistor.

41. A method as defined in claim 36 wherein said step of preparing a body of semiconductor material comprises:
   depositing on said substrate of insulating material a first layer of semiconductor material of a first conductivity type and a first dopant concentration, said first layer including, a first major surface, and a second major surface contiguous with said major surface, and a second major surface contiguous with said substrate;
   depositing a first dopant species in said first layer for forming a second layer of semiconductor material therein of a second dopant concentration, said second layer being adjacent to said substrate;
   depositing a second dopant species in said first layer for forming a third layer of semiconductor material therein of a third dopant concentration, said third layer being adjacent to said major surface and spaced apart from said second layer by a zone of semiconductor material of said first dopant concentration.

42. A method as defined in claim 41, wherein said step of depositing on said substrate a first layer comprises epitaxially depositing a layer of silicon on a sapphire substrate.

43. A method as defined in claim 42, wherein said step of depositing a first dopant species comprises ion implanting atoms through said sapphire substrate.

44. A method as defined in claim 41, wherein said step of depositing a second dopant species comprises ion implanting atoms into said first major surface of said first layer.

45. A method as defined in claim 41, wherein said step of forming a region of dielectric material comprises depositing silox between ones of said mutually separated body portions.

46. A method as defined in claim 36, further comprising the step of interconnecting ones of said mutually separated bodies with one another to form a circuit.

47. A monolithic integrated circuit comprising:
   a common body accommodating a plurality of semiconductor circuit elements adjacent at least a major surface of said body and comprising a plurality of mutually separated semiconductor islands, said islands being separated by dielectric material, a first island including a first surface including first, second, and third surface zones forming the drain, channel, and source regions respectively of a first field effect transistor, and a second surface including a first surface zone forming the gate electrode region of a second field effect transistor;
   biasing means connected to said source and said drain regions of said first field effect transistor;
   conductor means adjacent said channel region of said first field effect transistor for forming the gate electrode of said first field effect transistor;
   and means interconnecting other circuit elements of the body with said first field effect transistor for initiating or utilizing its current flow.

48. A circuit as defined in claim 47, wherein a second island disposed adjacent said first island includes said second field transistor, said second island including a first surface including first, second, and third surface zones disposed adjacent said second surface of said first one of said islands, said surface zones of said first surface of said second island forming the drain, channel, and source regions respectively of said second field effect transistor.

* * * * *